United States Patent [19]

Higashi et al.

[11] Patent Number: 4,796,072
[45] Date of Patent: Jan. 3, 1989

[54] SOLID-STATE IMAGING DEVICE WITH POTENTIAL BARRIERS BETWEEN PIXELS

[75] Inventors: Akio Higashi; Haruji Shinada, both of Kanagawa, Japan

[73] Assignee: Fuji Photo Film Co., Ltd., Kanagawa, Japan

[21] Appl. No.: 932,412

[22] Filed: Nov. 19, 1986

[30] Foreign Application Priority Data

Nov. 22, 1985 [JP] Japan .................. 60-261455

[51] Int. Cl.[4] .................. H01L 27/14; H01L 29/78
[52] U.S. Cl. .................. 357/30; 357/15; 357/33; 357/40; 357/41; 357/23.1; 357/45; 357/22; 357/24; 358/211; 358/213.2; 358/213.11; 250/211 J; 250/211 R; 250/578
[58] Field of Search .................. 357/30 C, 30 I, 30 L, 357/30 D, 30 H, 30 K, 2, 15, 24 LR, 32, 33, 37, 40, 41, 45, 22 R, 22 A, 22 B, 22 F, 23.1, 23.9, 23.11, 47, 48; 358/211, 213.12, 213.11; 250/211 S, 211 R, 578

[56] References Cited

U.S. PATENT DOCUMENTS

| 4,323,912 | 4/1982 | Koike et al. | 357/30 I |
| 4,381,517 | 4/1983 | Harada | 377/23.1 |
| 4,419,604 | 12/1983 | Ishioka et al. | 357/2 |
| 4,589,003 | 5/1986 | Yamada et al. | 357/2 |
| 4,739,384 | 4/1988 | Higashi et al. | 357/30 |

*Primary Examiner*—William L. Sikes
*Assistant Examiner*—Georgia Y. Epps
*Attorney, Agent, or Firm*—Sughrue, Mion, Zinn, Macpeak, and Seas

[57] ABSTRACT

A solid-state imaging device comprising an MOS scanning circuit over which is formed an array of photoconductive imaging elements. The imaging elements are separated by doped regions which create potential barriers against the movement of carriers of the photoconductive regions.

14 Claims, 2 Drawing Sheets

SOLID-STATE IMAGING DEVICE WITH POTENTIAL BARRIERS BETWEEN PIXELS

BACKGROUND OF THE INVENTION

1. Field of the Invention

The present invention relates to a solid-state imaging device having a scanning circuit and a photoconductive film formed in layers on a semiconductor substrate.

2. Background Art

In order to obtain a high photosensitivity, a conventional solid-state imaging device with a multi-layered structure employs a photoconductive film made of amorphous silicon placed on a scanning circuit substrate. The scanning circuit on the substrate may be of a type such as MOS (metal-oxide-silicon), CCD (charge-coupled device) or BBD.

However, one problem with the conventional multi-layered solid-state imaging device is that the sheet resistivity of the amorphous silicon used as a photoconductive material is slightly lower than that of the other materials. This relative resistivity causes a significant reduction in resolution and increases the chance of color mixing. This problem can be eliminated by increasing the sheet resistivity of the amorphous silicon film. However, in this case, carrier mobility is decreased or the trap density is increased, producing an after-image of greater intensity.

Another approach is to isolate the picture elements (pixels) in the photoconductive film by, for instance, oxide regions. However, the process of fabricating such an isolated solid-state imaging device needs an extra step for the minute processing. Therefore, the number of fabricating steps is increased, as a result of which cost becomes high.

SUMMARY OF THE INVENTION

An object of the present invention is to eliminate the above-described problems.

The present invention provides a solid-state imaging device comprising a semiconductor substrate having a scanning circuit for a plurality of pixels and a photoconductive film unit disposed on the semiconductor substrate. The photoconductive film unit has, at a position separating the pixels, an impurity-doped region for forming a potential barrier against carriers.

DESCRIPTION OF THE PREFERRED EMBODIMENTS

Figure 1A:
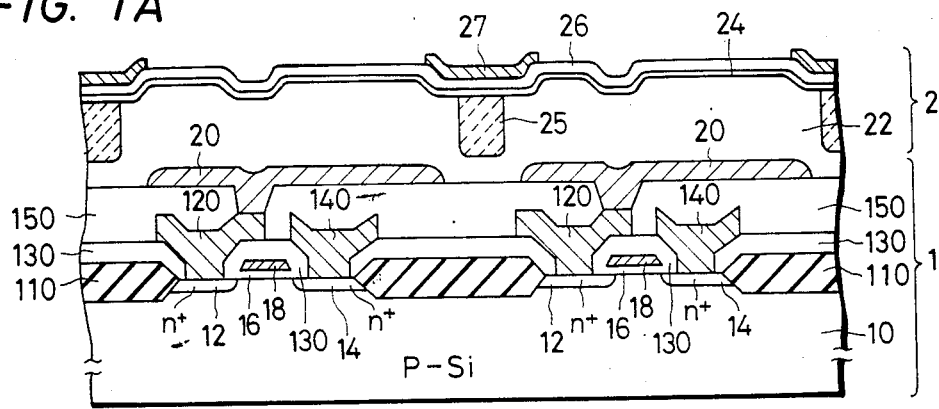
FIG. 1A shows a sectional view of a solid-state imaging device in accordance with an embodiment of the present invention.
Figure 1B:
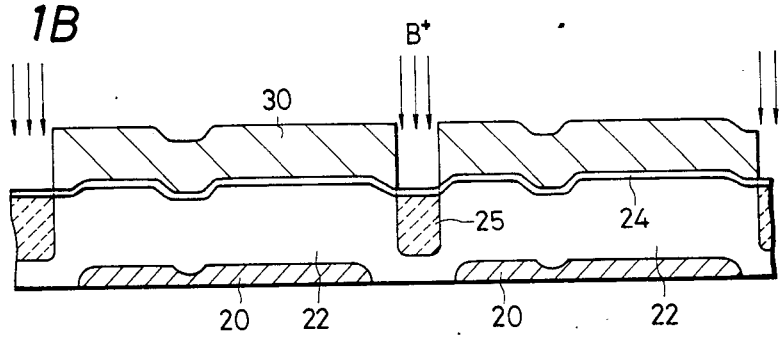
FIGS. 1B through 1D are sectional views illustrating a sequence of steps for fabricating the solid-state imaging device of FIG. 1A.
Figure 1C:
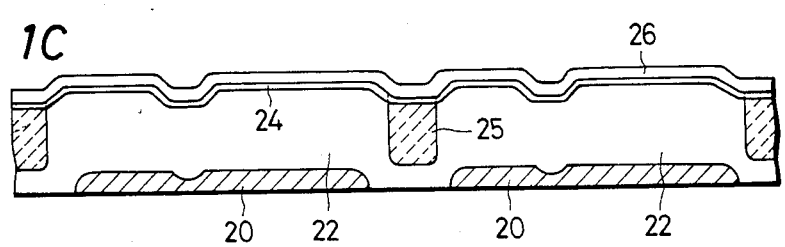
Figure 1D:
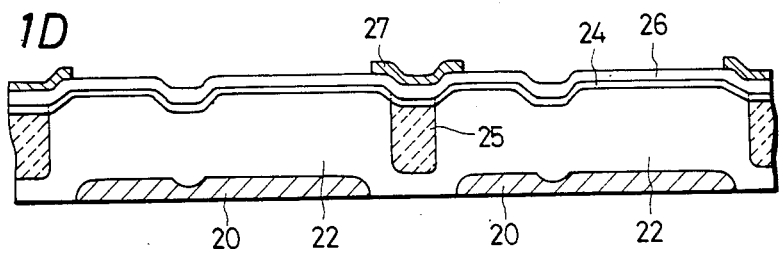

FIG. 1A shows a solid-state imaging device fabricated in accordance with an embodiment of the present invention. FIGS. 1B through 1D show an example of steps for fabricating the imaging device of FIG. 1A. In these Figures, a scanning circuit substrate 1 is disposed beneath a photoconductive film unit 2. The scanning circuit substrate 1 may be implemented in any of the known device forms such as MOS, CCD, or BBD. The following description assumes that the scanning circuit substrate 1 is implemented with MOS-type devices.

Specifically, the scanning circuit substrate 1 has a plurality of MOS field-effect transistors 16, each composed of an n+ source 12, an n+ drain 14 and a gate 18, placed on a p (poly)-Si (silicon) substrate 10. The individual MOS field-effect transistors are isolated from each other by an $SiO_2$ insulating layer 110. The gate 18 is buried within an insulating layer 130 made of PSG (phosphorous silicate glass) or $SiO_2$. An electrode 120 connected to the source 12 is partially covered with an insulating layer 150 made of PSG, $SiO_2$, $Si_3N_4$ or an organic material such as polyimide, and is uniformly overlaid with a substrate electrode layer 20. The substrate electrode layer 20 is connected to the source 12 and defines a single picture element (pixel). The substrate electrode layer 20 may be made of Al-Si, Al-Si-Cu or a transition metal such as Mo.

The photoconductive film unit 2 is formed on the substrate electrode layer 20, by the following procedure:

First, a boron-doped, high resistance, i-type, hydrogenated, amorphous silicon (a-SiH) film (or an undoped, n-type amorphous silicon film) 22 is deposited with its thickness being in a range of 0.5 to 3.0 micrometer on the substrate electrode layer 20. On the i-type (or n-type) a-SiH film 22, there is formed an impurity-doped p-type, hydrogenated, amorphous silicon (a-SiH) film 24 with a thickness of 5 to 50 nm.

Then, in order to form a p+ region 25 (impurity-doped region) in the i-type a-SiH film 22 as a channel stopper for carriers, a processing step may follow as will be described below.

First, as shown in FIG. 1B, a photo-resist (or electron-resist) pattern 30 corresponding to the pixel areas is deposited on the p-type a-SiH film 24. Then, ions are injected into the a-SiH film 22 under the following condition, for example.

The Ion Injection Condition

Acceleration voltage is in a range of 50 to 200 keV.

Group-III ions, such as $B^+$ or $In^+$ are injected, with an implanted dose being in a range from $1 \times 10$ to $1 \times 10^{16}$ $cm^{-2}$.

After this ion implantation, the resist pattern 30 is removed from the p-type a-SiH film 24 with an asher, and the imaging device is cleaned. Then, in order to eliminate defects formed in the a-SiH film 22 during the above-described ion injection, and in order to activate the injected ions, the imaging device is subjected to $H_2$ plasma annealing, as result of which a channel stop p+ region 25 is formed in the a-SiH film 22.

The $H_2$ plasma annealing is conducted with the following procedure.

First, the sample imaging devices are placed in a plasma generator having inductive or capacitive-coupling at the anode side. After the inside of the plasma generator is pumped to a high vacuum state, $H_2$ gas is fed into the plasma generator and a plasma is generated. Then, the sample devices are exposed in the generated plasma gas. The plasma annealing is carried with the following condition:

Plasma Annealing Condition

Pressure: 0.1 to 10 torr
Temperature of the sample imaging devices: 150° to 350° C.
Length of time for Annealing: 30 minutes to 1 hour Since by the above-described process the p+ region 25 is formed in the a-SiH film 22 at a position between the pixels, there is formed a potential barrier for carriers (electrons), at the p+-i junction between the region 25 and the i film 22. Therefore, it becomes possible to effectively inhibit movement of the carriers (electrons) between pixels, so that color mixing in the sheet direction is eliminated.

Defects formed in the a-SiH film 22 by the ion implantation are reduced as follows. Hydrogen atoms in the a-SiH film 22 are diffused by the above-described plasma annealing, and are bonded with dangling-bonds formed during the ion injection in the a-SiH film 22, so that the defects are annealed out.

After the above-described annealing, a transparent electrode layer 26 is formed on the p-type a-SiH film 24 by sputtering, as shown in FIG. 1C. The sputtering conditions for the material forming the transparent electrode layer 26 are as follows:

Sputtering Condition

Material: ITO, $In_2O_3$, or the like
Thickness of the layer 26: 5 to 50 nm
Temperature of sample imaging devices: 100° to 250° C.

Then, a light-shielding layer 27 is deposited on the transparent electrode layer 26, by electron beam evaporation or sputtering. The light-shielding layer 27 is made of a metal such as Al, Al-Si-Cu, Mo, Cr or W. The thickness of the layer 27 is in a range of 100 to 300 nm. The so-deposited light-shielding layer 27 is selectively subjected to resist patterning and etching in areas corresponding to the light-receiving portions, that is, in the area of the pixels. As a result, the light-shielding layer 27 remains on the transparent electrode layer 26 only in the areas of the channel stopper p+ region 25, as shown in FIG. 1D.

As described above, a multi-layered solid-state imaging device shown in FIG. 1A is obtained.

Figure 2A:
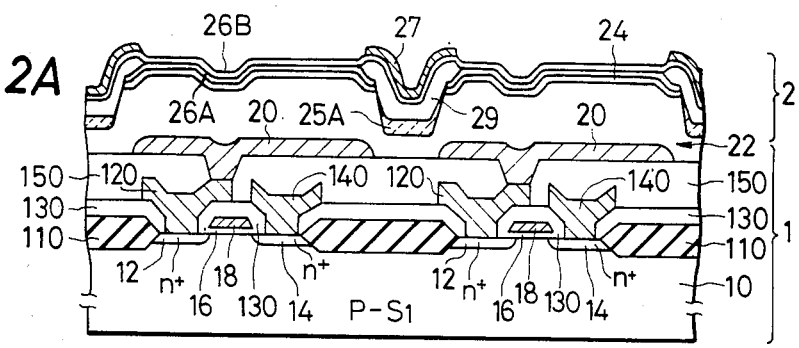
FIG. 2A shows a sectional view of a solid-state imaging device in accordance with another embodiment of the present invention.

FIG. 2A shows another embodiment of a solid-state imaging device according to the present invention. FIGS. 2B through 2F show one example of a sequence of steps for fabricating the imaging device of FIG. 2A. The same numerals or characters designate same or like portions shown in FIGS. 1A through 1D. In these Figures, a scanning circuit substrate 1 has a plurality of MOS field-effect transistors (MOSFETs) 16, each comprising a source 12, a drain 14 and a gate 18, on a p (poly)-Si (silicon) substrate 10. The individual MOS field-effect transistors are isolated from each other by an insulating layer 110. An electrode 120 is connected to the source 12. The gate 18 is buried within an insulating layer 130, and the electrode 120 is covered with an insulating layer 150. An electrode 140 is connected to the drain 14.

Figure 2B:
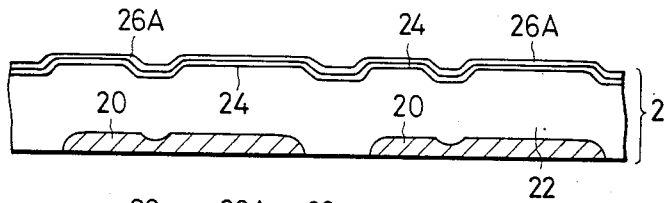
FIGS. 2B through 2F are sectional views showing a sequence of steps for fabricating the solid-state imaging device of FIG. 2A.

A photoconductive film unit 2 is formed on a substrate electrode layer 20 connected to the electrode 120. A sequence of process steps for fabricating the photoconductive film unit 2 of FIG. 2A is as follows:

First, as shown in FIG. 2B, an i-type, a-SiH film 22 is deposited on the substrate electrode 20 with its thickness being in a range of 0.5 to 3.0 micrometer. A p-type, a-SiH film 24 is deposited on the i-type, a-SiH film 22, with its thickness in a range from 5 to 50 nm. On the p-type, a-SiH film 24, a first transparent electrode layer 26A made of ITO or the like is deposited.

Figure 2C:
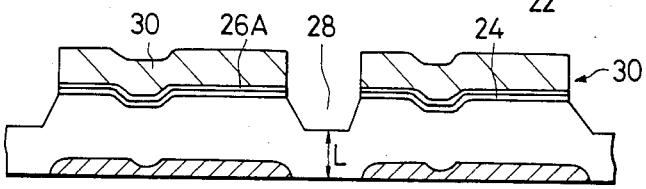

Secondly, as shown in FIG. 2C, a resist pattern 30 is deposited on the first transparent electrode layer 26A, in correspondence with the picture element areas (pixels). The first transparent electrode layer 26A, the p-type a-SiH film 24 and the i-type a-SiH film 22 are subjected to patterning, at the portions which are exactly below the areas patterned (opened) by the resist pattern 30, by the use of a RIE (reactive ion etching) device or a dry-etching device. As a result, a groove 28 is formed in the i-type a-SiH film 22, with a distance L between the bottom surface of the groove 28 and the insulating layer 150 being in a range of 0.5 to 1.0 micrometer.

Then, a series of steps follow corresponding to the steps in the process for fabricating the imaging device of the first embodiment.

Figure 2D:
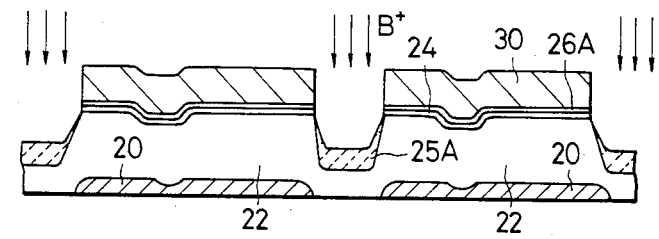

As shown in FIG. 2D, group-III ions such as B+ or In+ are injected into the i-type a-SiH film 22, using the same resist pattern 30 as used for forming the groove 28. After the ion injection, the resist pattern 30 is removed, and the imaging device is cleaned. The imaging device is then subjected to $H_2$ plasma annealing in order to reduce the defects formed during the ion injection in the a-SiH film 22 and in order to activate the injected ions. As a result, a p+ region 25A is formed in the i-type a-SiH film 22.

In this embodiment, there is formed not only the channel stopper p+ region 25A but also a groove 28, so that it becomes possible to reduce the cross talk across the spaces between pixels more effectively.

Figure 2E:
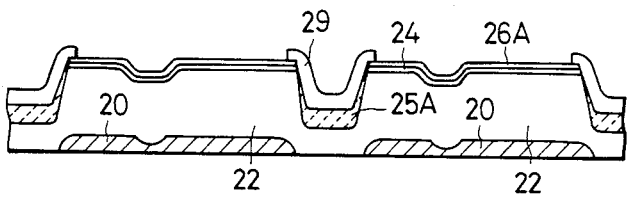

Then, as shown in FIG. 2E, an insulating layer 29 is deposited on the first transparent electrode layer 26A and the groove 28, by a plasma CVD method. The insulating layer 29 is made of non-organic materials such as $p-Si_3N_4$, $p-SiO_2$, p-PSG or organic materials such as polyimide. The thickness of the insulating layer 29 is in a range of 0.5 to 1.5 micrometer. The insulating layer 29 is opened at the light receiving portions by the use of a resist pattern. In other words, the insulating layer 29 is removed at the portions corresponding to the light receiving areas so that only the portions of the insulating layer 29 overlying the grooves 28 remain. In the case where the insulating layer 29 is made of $p-Si_3N_4$, for instance, the opening of the light receiving areas is conducted by the dry-etching method with a $CF_4+O_2$ gas.

Figure 2F:
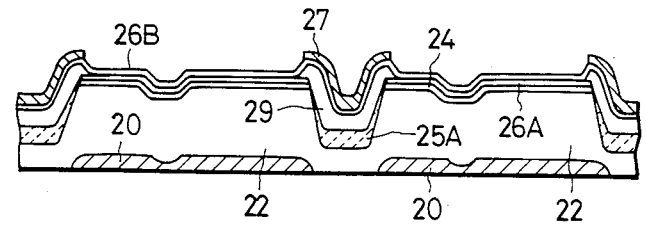

As shown in FIG. 2F, a second transparent electrode layer 26B is deposited both on the first transparent electrode layer 26A and the insulating layer 29, with its thickness of 20 to 200 nm. Furthermore, a light-shielding layer 27 is formed on the second transparent electrode layer 26B, except on the light receiving portions, in the same manner as described in the description of the first embodiment. The light-shielding layer 27 is made of a metal such as Al, Al-Si-Cu, Mo, Cr or W. The thickness of the light-shielding layer 27 is in a range of 100 to 300 nm.

As described above, a multi-layered solid-state imaging device having a construction shown in FIG. 2A is thus obtained.

While the above descriptions are directed to a multi-layered solid-state imaging device using amorphous silicon, the present invention may be widely applicable in the semiconductor devices using amorphous silicon, for attaining electrical insulation or isolation. It would be apparent that the present invention may be effectively applicable to a photoelectric converter or a semiconductor device using amorphous silicon, such as a line sensor, CCD, TFP (thin film transistor), a solar cell, a photoreceptor, or the like.

As described above, according to the present invention, with a simple sequence of fabricating steps, it is possible to obtain a multi-layered solid-state imaging device attaining high resolution and effectively minimizing color-mixing.

What is claimed:

1. A solid-state imaging device comprising:
   a semiconductor substrate having formed therein a scanning circuit for a plurality of photoconductive picture elements and including at least one semiconductor gate for each of said picture elements; and
   a photoconductive film unit disposed on said semiconductor substrate in an area of said scanning circuit and including said plurality of photoconductive picture elements having a type of semiconductive carriers,
   wherein said photoconductive film unit has, at positions separating said picture elements, impurity-doped regions, said impurity-doped regions forming potential barriers for said carriers.

2. A solid-state imaging device according to claim 1, wherein said photoconductive film unit further comprises grooves at said positions separating said picture elements, said impurity-doped regions being formed in said groove.

3. A solid-state imaging device according to claim 1, wherein said impurity-doped regions are of a first conductivity type and said photoconductive elements each comprise a photoconductive region being intrinsic.

4. A solid-state imaging device according to claim 2, wherein said impurity-doped regions are of a first conductivity type and said photoconductive elements each comprise a photoconductive region being intrinsic.

5. A solid-state imaging device according to claim 3, wherein said impurity-doped regions contain implanted ions.

6. A solid-state imaging device according to claim 4, wherein said impurity-doped regions contain implanted ions.

7. A solid-state imaging device according to claim 5, wherein said scanning circuit comprises a plurality of MOS transistors and said photoconductive regions comprise amorphous silicon.

8. A solid-state imaging device according to claim 6, wherein said scanning circuit comprises a plurality of MOS transistors and said photoconductive regions comprise amorphous silicon.

9. A solid-state imaging device according to claim 1, wherein said impurity-doped regions are of a first conductivity type and said photoconductive elements each comprise a photoconductive region being of a second conductivity type of a concentration substantially less than that of said first conductivity type in said impurity-doped regions.

10. A solid-state imaging device according to claim 9, wherein said impurity-doped regions contain implanted ions.

11. A solid-state imaging device according to claim 10, wherein said scanning circuit comprises a plurality of MOS transistors and said photoconductive regions comprise amorphous silicon.

12. A solid-state imaging device according to claim 2, wherein said impurity-doped regions are of a first conductivity type and said photoconductive elements each comprise a photoconductive region being of a second conductivity type of a concentration substantially less than that of said first conductivity type in said impurity-doped regions.

13. A solid-state imaging device according to claim 12, wherein said impurity-doped regions contain implanted ions.

14. A solid-state imaging device according to claim 13, wherein said scanning circuit comprises a plurality of MOS transistors and said photoconductive regions comprise amorphous silicon.

* * * * *